United States Patent [19]

Hosokawa et al.

[11] Patent Number: 5,014,145
[45] Date of Patent: May 7, 1991

[54] HEAD ARM STRUCTURE MOUNTING A CIRCUIT ELEMENT IN A MAGNETIC DISC DEVICE

[75] Inventors: Haruhiko Hosokawa; Asao Sasamoto; Hideaki Amano; Toshio Shiono; Akio Takatsuka; Sigeru Okamoto; Munesige Maeda; Chikayuki Sogabe, all of Odawara, Japan

[73] Assignee: Hitachi, Ltd., Tokyo, Japan

[21] Appl. No.: 214,679

[22] Filed: Jul. 1, 1988

[30] Foreign Application Priority Data

Jul. 10, 1987 [JP] Japan ................... 62-170901

[51] Int. Cl.$^5$ ............... G11B 33/12; G11B 33/14
[52] U.S. Cl. ........................ 360/104; 360/137
[58] Field of Search ............ 360/104, 109, 137

[56] References Cited
FOREIGN PATENT DOCUMENTS

| | | |
|---|---|---|
| 61-61223 | 8/1984 | Japan. |
| 59-168906 | 9/1984 | Japan. |
| 59-168968 | 9/1984 | Japan. |
| 61-168178 | 1/1985 | Japan. |
| 60-101776 | 6/1985 | Japan. |
| 61-287082 | 12/1986 | Japan. |

Primary Examiner—Vincent P. Canney
Assistant Examiner—David L. Robertson
Attorney, Agent, or Firm—Kenyon & Kenyon

[57] ABSTRACT

A head positioning system includes data head arms for supporting a data head, support head arms for supporting a support head, and a head actuator for rigidly moving the data and servo head arms as a unitary structure. When there is mounted an amplifier or the like is mounted on at least one of the head arms to change the warping amount depending upon the change in the environmental temperature, a portion of the head arm on which the amplifier is mounted is cut away therefrom but is left partly connected thereto, so that the head arms are all warped in nearly the same amount.

9 Claims, 5 Drawing Sheets

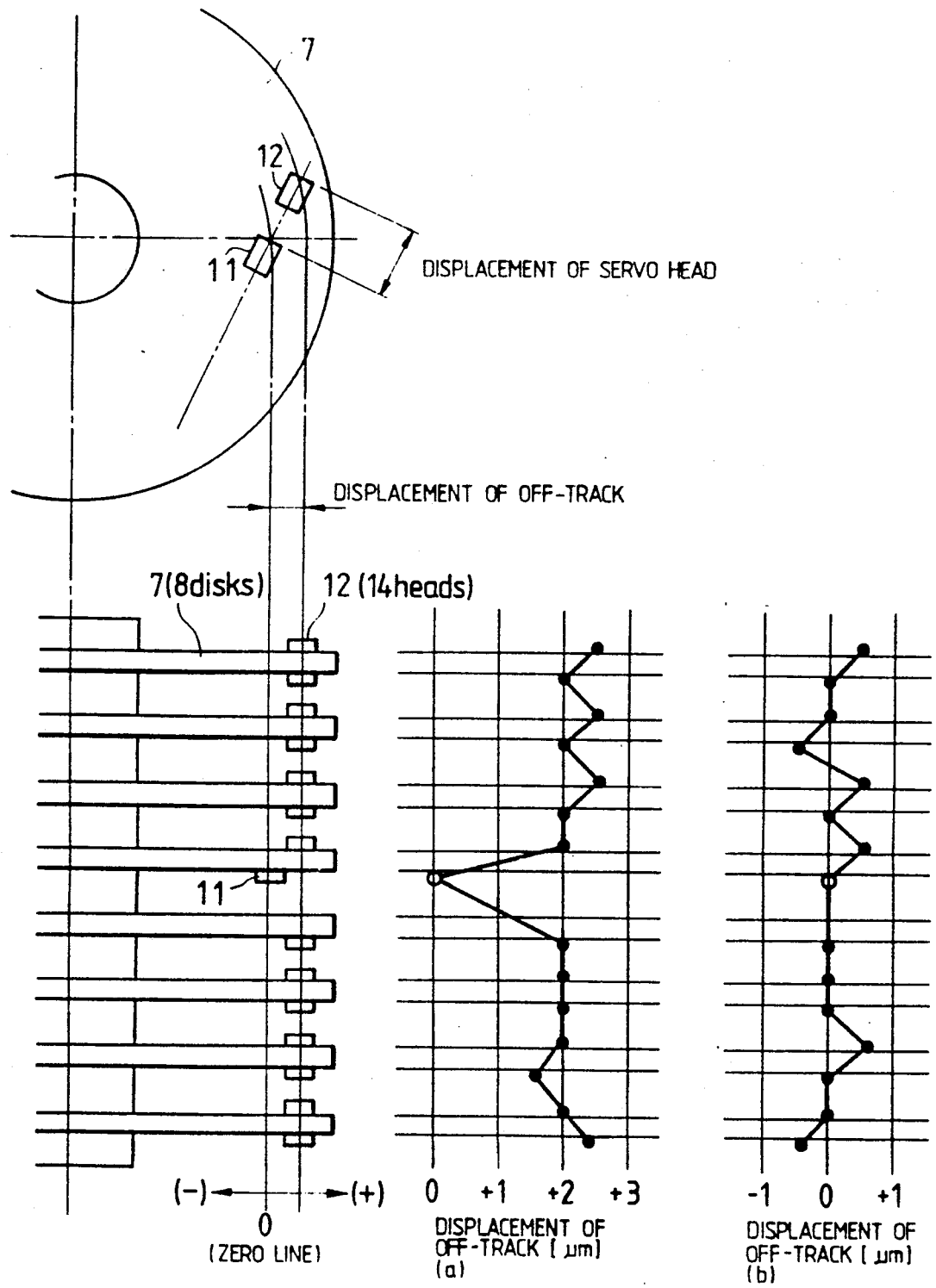

HEAD ARM STRUCTURE MOUNTING A CIRCUIT ELEMENT IN A MAGNETIC DISC DEVICE

BACKGROUND OF THE INVENTION

1. Field of the Invention

The present invention relates to a head positioning system in a fixed magnetic disc drive, and more specifically to a head positioning system in which an amplifier is mounted on a servo head arm to amplify a servo signal that works to determine the position of the magnetic head.

2. Description of the Related Art

In a head positioning system of a magnetic recording apparatus, in general, the signal from the servo head for positioning the head and the signal from the data head for recording and play back are transmitted through signal lines of flexible circuits that are stuck onto the head arm with an adhesive agent. On a servo arm supporting the servo head is mounted an amplifier which amplifies a servo signal to reduce noise. According to the prior art for mounting the amplifier on the servo head arm as shown in FIG. 7, a flexible structure has been employed in which leads 81 of an amplifier 8 are folded in the shape of a crank to mount the amplifier. In this system, the leads 81 of the amplifier 8 are soldered onto a flexible circuit 9 that is stuck onto a servo head arm 31 to transmit servo signals. In addition, the head arm 31 of a symmetrical shape has been employed as disclosed in Japanese Patent Laid-Open Nos. 168178/1986 and 61223/1986.

A flexible structured configuration in which the leads of the amplifier are folded like a crank and the system which employs the head arm of a symmetrical shape, is adopted such that the warp of the servo head arm becomes equal to the warp of the data head arm when the environmental temperature for the magnetic recording apparatus undergoes the change. Difference in the coefficient of thermal expansion of the head arm, signal lines of the flexible circuit and of materials of the amplifier gives rise to the occurrence of a problem when the environmental temperature undergoes the change. That is, the head arm is composed of aluminum, the signal line of flexible circuit is composed of copper and the amplifier is composed of alumina ceramic. Here, aluminum has a coefficient of thermal expansion of $23.8 \times 10^{-6}/°C.$, copper has a coefficient of thermal expansion of $17.5 \times 10^{-6}/°C.$ and alumina ceramic has a coefficient of thermal expansion of $6 \times 10^{-6}/°C.$ When the environmental temperature is changed, therefore, the head arm develops warping due to difference in the amounts of thermal expansion of the materials. The warp of the data head arm results from a difference in the amount of thermal expansion between aluminum and copper, and the warp of the servo head arm results from a difference in the amount of thermal expansion among aluminum, copper and alumina ceramic. The coefficient of thermal expansion of the alumina ceramic is smaller than those of aluminum and copper. Therefore, the warp of the servo head arm becomes greater than that of the data head arm. Therefore, positions of the data head and the servo head are deviated from each other resulting in the development of an off-track condition of a head on the magnetic disc.

There have heretofore been employed a system of a flexible structure for mounting the amplifier by folding the leads thereof in the form of a crank and a system which uses the head arm of a symmetrical shape as mentioned above, without, however, making it possible to bring the warping amount of the data head arm into conformity with the warping amount of the servo head arm.

SUMMARY OF THE INVENTION

In view of the above-mentioned problem, the object of the present invention is to provide a head positioning system having a function to bring the warping amount of the data head arm into conformity with the warping amount of the servo head arm irrespective of symmetry of the head arm, in order to eliminate the development of an off-track condition caused by the displacement of the servo head.

To achieve this object, the present invention deals with a recording/reproducing head positioning system equipped with a head actuator for rigidly moving a plurality of head arms as a unitary structure, the improvement wherein when there is a member that is mounted on at least one head arm among said head arms to change the amount of warping upon change in the environment, the portion of said head arm mounting said member is cut away but is left partly connected to said head arm.

BRIEF DESCRIPTION OF THE DRAWINGS

FIG. 13 is a diagram showing the measured amount of off-track caused by the displacement of the servo head.

DETAILED DESCRIPTION OF THE PRESENT INVENTION

First, the functions based upon the characteristic structure of the present invention will be described briefly. Behavior of the servo head arm of the aforementioned structure of the invention will be explained when the environmental temperature has changed. When the environmental temperature has changed as described earlier, the servo head arm is warped due to difference in the coefficient of thermal expansion among the head arm, flexible circuit signal line and amplifier.

In the servo head arm of the present invention, the amplifier mounting area of the servo head arm is surrounded by a narrow gap from the front and rear thereof in the lengthwise direction of the amplifier, and is separated away from the body of the servo head arm. Therefore, the warp caused by the servo head arm, flexible circuit signal line and amplifier develops in the amplifier mounting area only, and the body of the servo head arm is not affected.

The warp that develops on the body of the servo head arm is caused by the head arm and the flexible circuit signal line, and becomes equal to the warp that develops on the body of the data head arm. Therefore, the warping amount of the servo head arm becomes equal to the warping amount of the data head arm, which makes it possible to cancel the off-track condition that would otherwise stem from the deviation of the servo head when the environmental temperature has changed.

The foregoing and other objects, advantages, manner of operation and novel features of the present invention will be understood from the following detailed description when read in connection with the accompanying drawings.

Figure 1:
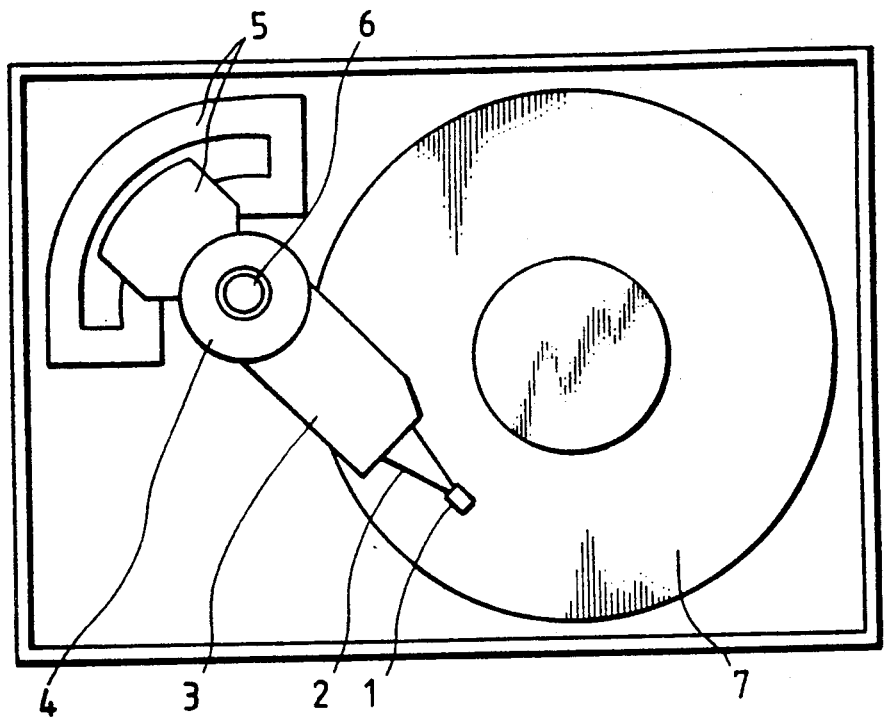
FIG. 1 is a plan view showing an embodiment of a magnetic recording apparatus in which an amplifier is mounted on a servo head arm.
Figure 2:
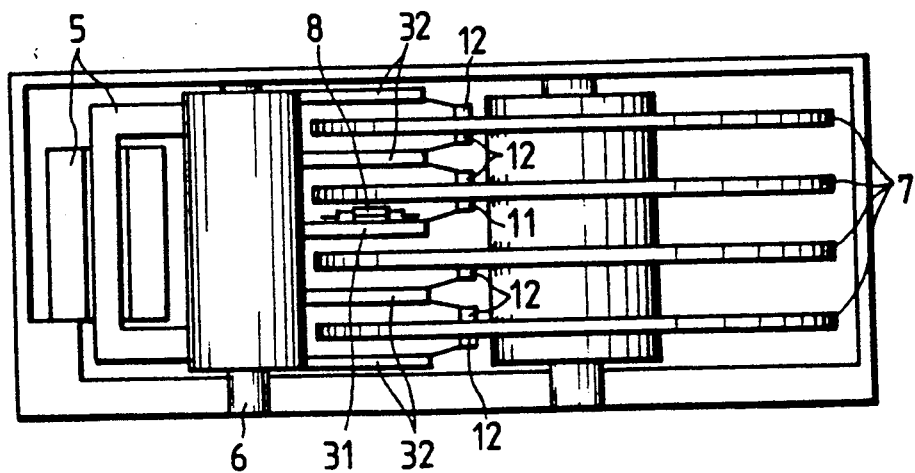
FIG. 2 is a section view of FIG. 1.

In FIGS. 1 and 2, reference numeral 1 denotes a magnetic head which is supported on a magnetic disc medium 7 by a load arm 2. The load arm 2 is secured to a head arm 3 which is fastened to a hub carriage 4 that is provided with a voice coil motor 5. The above-mentioned magnetic head 1, load arm 2, head arm 3, hub carriage 4 and voice coil motor 5 constitute a head positioning system. By driving the voice coil motor 5, the position of the head positioning system is selectively determined at any radial position on the magnetic disc medium 7 that turns beneath the magnetic head 1.

The magnetic head 1 includes a servo head 11 that deals with servo signals for positioning the head, and a data head 12 that deals with recording or reproducing signals. Similarly, the head arm 3 includes a servo head arm 31 that supports the servo head 11 and a data head arm 32 that supports the data head 12.

Figure 3:
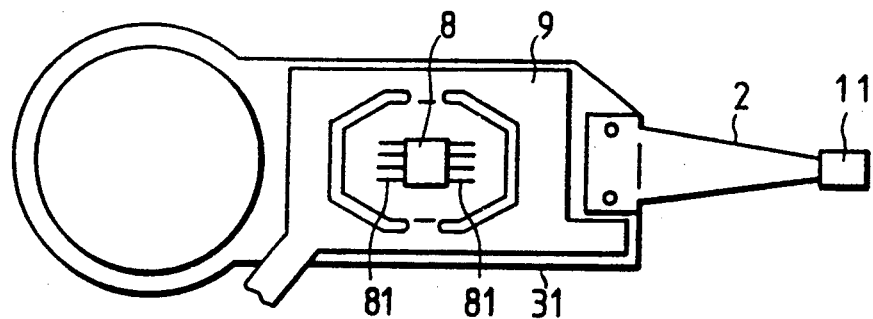
FIGS. 3 and 4 are diagrams illustrating the structure of a servo head arm assembly according to the present invention.
Figure 4:
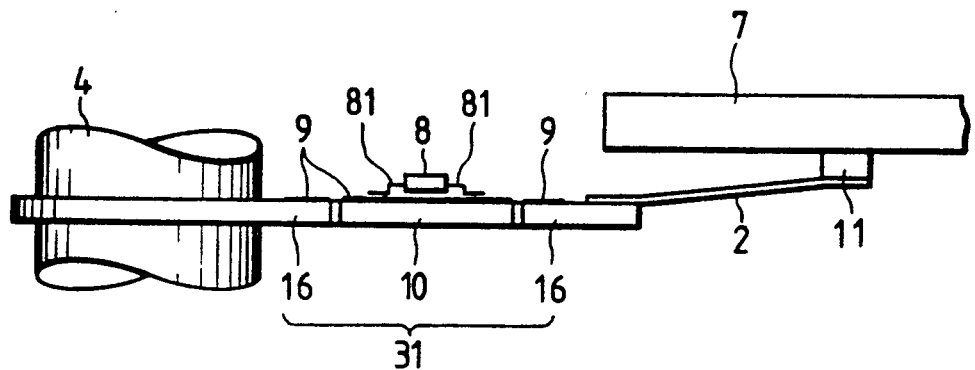

With reference to FIGS. 3 and 4, the head arms 31 and 32 are stuck a flexible circuit 9 for transmitting signals from the magnetic heads 11 and 12. Signals of the magnetic heads 11 and 12 are transmitted over signal lines of the flexible circuit 9. An amplifier 8 for amplifying servo signals is mounted on the servo head arm 31, and leads 81 of the amplifier are soldered to the signal lines of the flexible circuit 9 to connect the amplifier 8 to the flexible circuit 9 and to amplify the servo signals. The leads 81 of the amplifier are folded in the form of a crank to realize a flexible structure as shown in FIGS. 3 and 4.

Figure 5:
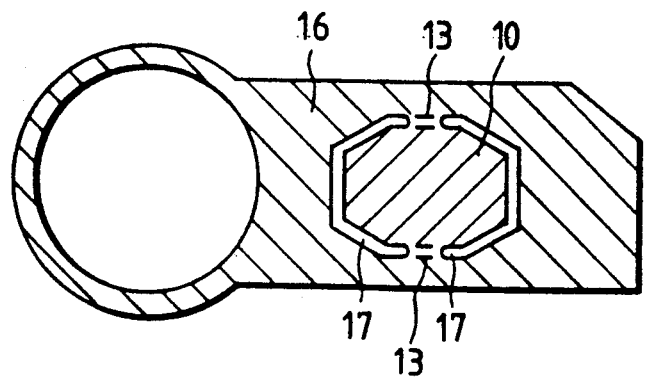
FIG. 5 is a diagram illustrating the structure of the servo head arm of FIG. 3.
Figure 6:
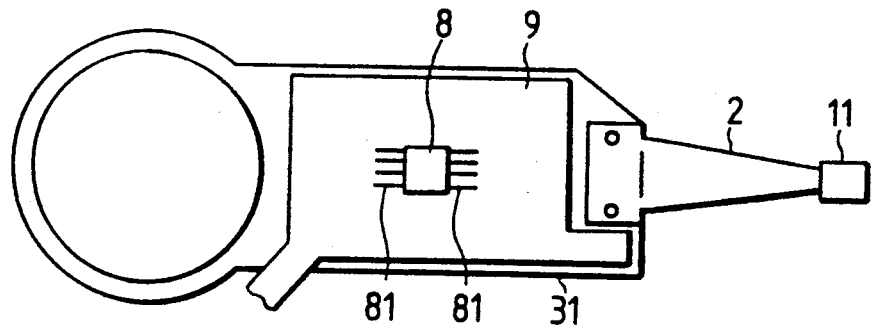
FIGS. 6 and 7 are diagrams illustrating the structure of a conventional servo head arm assembly.
Figure 7:
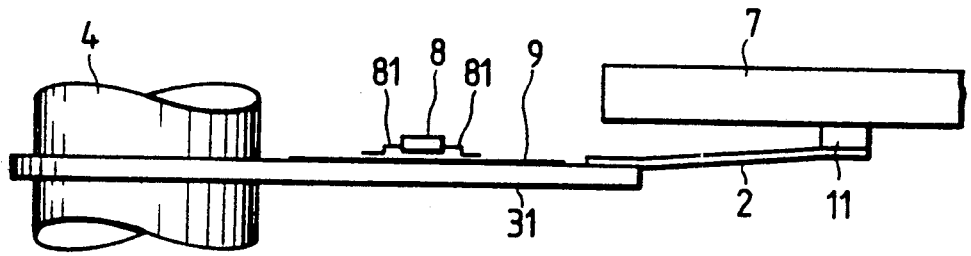
Figure 8:
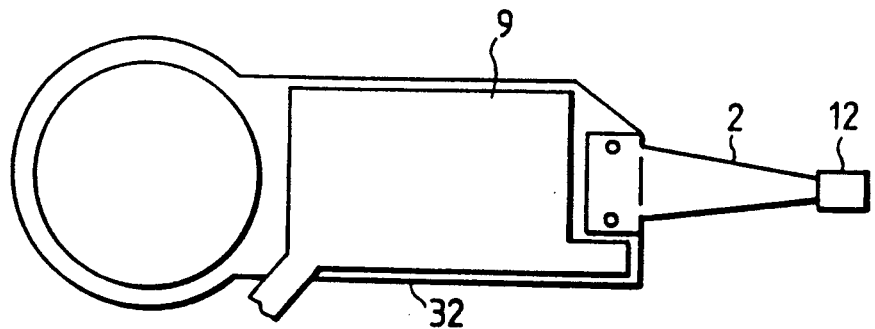
FIGS. 8 and 9 are diagrams illustrating the structure of a data head arm assembly.
Figure 9:
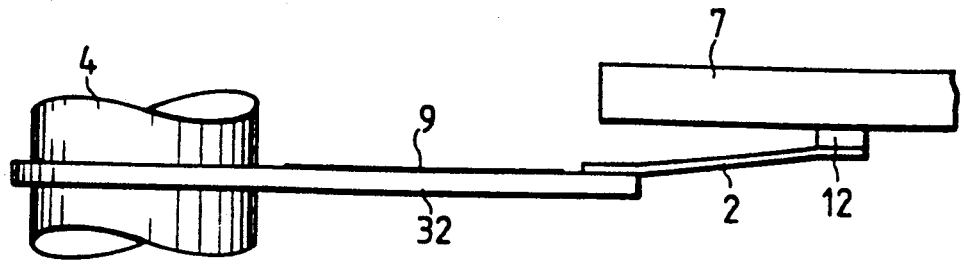
Figure 10:
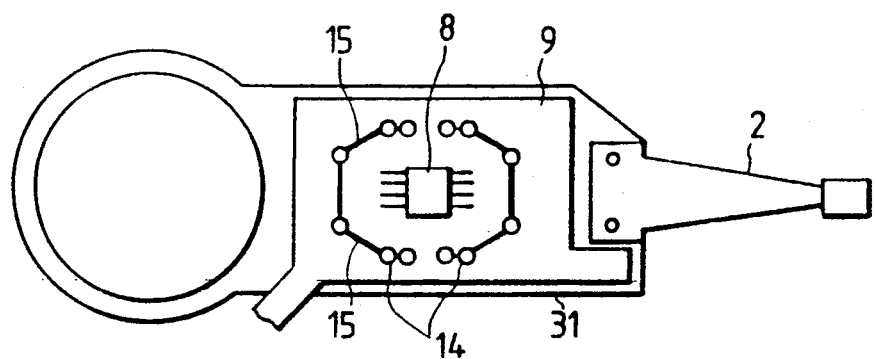
FIG. 10 is a diagram showing the servo head arm according to another embodiment of the present invention.

An amplifier mounting area 10 of the servo head arm 31 is separated away from the body 16 of the servo head arm via narrow gaps 17 of the shape of a square bracket formed in the servo head arm 31. The amplifier mounting area 10 and the body 16 of the servo head arm are left connected together through parts 13 connecting to the body of servo head arm. That is, as shown in FIG. 5, the servo head arm 31 is comprised of the amplifier mounting area 10, body 16 of servo head arm, narrow gaps 17, and parts 13 connecting to the body of servo head arm. In the conventional servo head arm 31 as shown in FIGS. 6 and 7, there are formed no narrow gaps 17 in the shape of a square bracket, and the amplifier mounting area 10 is not distinguished over the body 16 of the servo head arm. It is also allowable to form small holes 14 and grooves 15 as shown in FIG. 10 instead of forming the narrow gaps 17.

Functions and effects of the embodiment will now be described.

Figure 11:
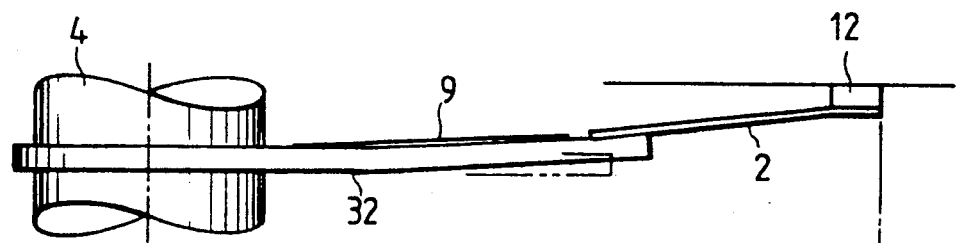
FIGS. 11 and 12 are diagrams explaining the deformation of the head arm of the case where the environmental temperature has changed.
Figure 11:
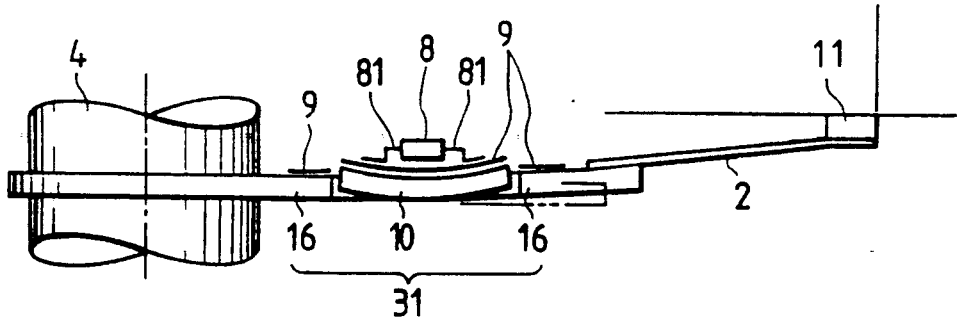
Figure 12:
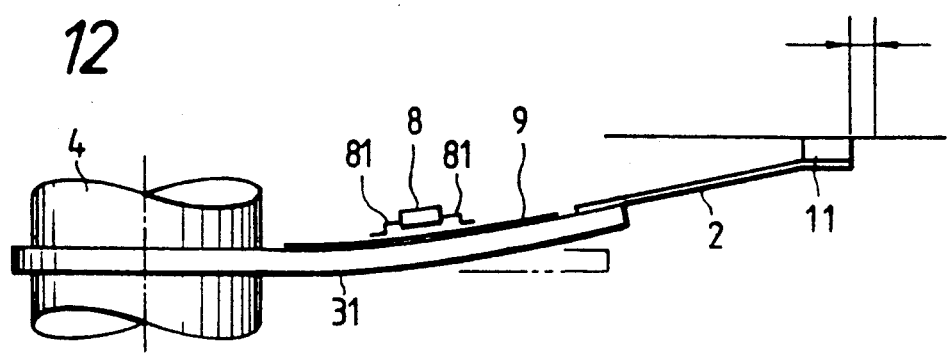

FIG. 11 illustrates the behaviour of the head arms 31 and 32 when the environmental temperature has changed. When the environmental temperature changes, warp develops on the head arm due to the difference in the coefficient of thermal expansion between the head arms 31, 32 and the signal lines of the flexible circuit 9. In particular, the servo head arm 31 on which the amplifier 8 is soldered warps to an extent greater than that of the data head arm 32.

Here, according to the present invention, the servo head arm 31 is provided with the amplifier mounting area 10 which is separated away from the body 16 of the servo head arm. That is, the warp on the head arm due to the amplifier 8 appears only on the amplifier mounting area 10 but does not affect the body 16 of the servo head arm. Moreover, the flexible structure in which leads 81 of the amplifier are folded in the form of a crank helps reduce the warp that develops on the amplifier mounting area 10.

Owing to the above-mentioned structure, the warp appearing on the body 16 of the servo head arm stems solely from the difference in the coefficient of thermal expansion between the body 16 of the servo head arm and the signal lines of the flexible circuit 9. This warping is equal to the one that is produced by the data head arm 32 and the signal lines in the flexible circuit 9. That is, both the servo head arm 31 and the data head arm 32 exhibit the same behaviour for the change of environmental temperature, and the servo head is not displaced by the change in the environmental temperature.

FIG. 13 shows the measured results of the displacement of off-track using a magnetic disc device comprised of eight magnetic disc media 7, fourteen data heads 12, and one servo head 11 mounted between the fourth and fifth magnetic disc media 7, at an environmental temperature of 50° C. FIG. 13(b) shows the case of when the servo head arm of the present invention is used, and FIG. 13(a) shows the case of when the conventional servo head arm is used. It will be recognized that the off-track condition caused by the displacement of the servo head found in FIG.13(a) does not appear in FIG.13(b).

According to the servo head arm assembly mounting the amplifier of the present invention, the warp on the servo head arm caused by the change in the environmental temperature is allowed to develop on the amplifier mounting area only, so that the body of the servo head arm is not affected by the warping. That is, the body of the servo head arm and the body of the data head arm exhibit the same behaviour when the environmental temperature changes. Therefore, the head positioning system of the magnetic recording apparatus in which the amplifier is mounted on the servo head to decrease noise in the servo signals, does not develop off-track that stems from the displacement of the servo head even when the environmental temperature has changed.

What is claimed is:

1. A head arm structure in a magnetic disc device comprising:
   a magnetic head for recording/reproducing signals to or from a magnetic disc;
   a head arm supporting said magnetic head and made of a first material, said arm including first and second arm regions, said second arm region having a boundary nearly surrounding the second arm region and separating said second arm region from said first arm region, said second arm region being connected to said first arm region by a small area;

a flexible circuit having a first region mounted on said first arm region and a second region mounted on said second arm region, said first region being connected to said second region; and a circuit element amplifying the signals reproduced from said magnetic head, said circuit element being mounted on said second region of said flexible circuit.

2. A head arm structure according to claim 1, wherein said boundary is a slit.

3. A head arm structure according to claim 2, wherein said slit is formed as a narrow gap formed in said first material.

4. A head arm structure according to claim 1, wherein said second region of said flexible circuit is nearly in the same shape as said second arm region of said head arm nearly surrounded by said boundary.

5. A head arm structure according to claim 4, wherein said boundary of said second arm region of said head arm and a boundary of said second region of said flexible circuit are formed by forming a narrow gap in said head arm and in said flexible circuit.

6. A head arm structure according to claim 1, wherein said small area is formed at two points which lie nearly in a direction at right angles to the lengthwise direction of said head arm.

7. A head arm structure according to claim 1, wherein said circuit element generates heat causing the warping of said second region of said flexible circuit, said warping being prevented from being transmitted to said first arm region of said head arm by said boundary.

8. A head arm structure in a magnetic disc device comprising:

a data head arm supporting a magnetic head for recording/reproducing signals to or from a magnetic disc corresponding to said data head arm;

a servo head arm supporting a magnetic head for reading out a positioning servo signal from a magnetic disc corresponding to said servo arm which is made of a first material, said servo head arm which first and second arm regions, said portion arm region having a boundary nearly surrounding the second arm region and largely separating said first arm region from said second arm region, said first arm region being connected by a small area to said second arm region;

a flexible circuit having a first region mounted on said first portion of said servo head arm and a second region mounted on said second portion of said servo head arm, said first region being connected to said second region; and a circuit element for amplifying said servo signal read out from the corresponding magnetic head, said circuit element being mounted on said second region of said flexible circuit.

9. A head arm structure in a magnetic disc device comprising:

a plurality of magnetic heads for recording/reproducing signals to or from the respectively corresponding one of magnetic discs;

a plurality of head arms made of a first material each supporting said magnetic heads respectively, each of said arms having first and second arm regions, said second arm region having a boundary almost surrounding the second arm region and largely separating said second arm region from said first arm region, said second arm region being connected to said first arm region by a small area;

a plurality of flexible circuits, each flexible circuit corresponding to one of said head arms, and having a first region mounted on said corresponding first arm region and a second region mounted on said corresponding second arm region, said first region being connected to said second region; and a circuit element amplifying the signals reproduced from one of said magnetic heads, said circuit element being mounted on said second region of said corresponding flexible circuit nearly surrounded by said boundary of the corresponding head arm.

* * * * *